US010508021B2

(12) United States Patent
Chou

(10) Patent No.: US 10,508,021 B2
(45) Date of Patent: Dec. 17, 2019

(54) MICROELECTROMECHANICAL SYSTEMS (MEMS) STRUCTURE TO PREVENT STICTION AFTER A WET CLEANING PROCESS

(71) Applicant: Taiwan Semiconductor Manufacturing Co., Ltd., Hsin-Chu (TW)

(72) Inventor: Chung-Yen Chou, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 186 days.

(21) Appl. No.: 15/615,238

(22) Filed: Jun. 6, 2017

(65) Prior Publication Data
US 2017/0267516 A1    Sep. 21, 2017

Related U.S. Application Data

(62) Division of application No. 14/699,070, filed on Apr. 29, 2015, now Pat. No. 9,676,606.

(51) Int. Cl.
*B81B 3/00* (2006.01)
*B81C 1/00* (2006.01)

(52) U.S. Cl.
CPC .......... *B81B 3/001* (2013.01); *B81C 1/00952* (2013.01); *B81B 2203/0163* (2013.01); *B81B 2207/012* (2013.01); *B81C 2201/013* (2013.01)

(58) Field of Classification Search
CPC combination set(s) only.
See application file for complete search history.

(56) References Cited

U.S. PATENT DOCUMENTS 9,364,174 B2 *   6/2016   Lin ..................... G01N 27/327
2006/0049826 A1 *  3/2006  Daneman ............. G02B 6/3518
                                        324/207.13

(Continued)

FOREIGN PATENT DOCUMENTS

CN       101580222 A    11/2009

OTHER PUBLICATIONS

Non-Final Office Action dated Jun. 22, 2016 for U.S. Appl. No. 14/699,070.

(Continued)

*Primary Examiner* — Moazzam Hossain
(74) *Attorney, Agent, or Firm* — Eschweiler & Potashnik, LLC

(57) ABSTRACT

A method for manufacturing a microelectromechanical systems (MEMS) structure with sacrificial supports to prevent stiction is provided. A first etch is performed into an upper surface of a carrier substrate to form a sacrificial support in a cavity. A thermal oxidation process is performed to oxidize the sacrificial support, and to form an oxide layer lining the upper surface and including the oxidized sacrificial support. A MEMS substrate is bonded to the carrier substrate over the carrier substrate and through the oxide layer. A second etch is performed into the MEMS substrate to form a movable mass overlying the cavity and supported by the oxidized sacrificial support. A third etch is performed into the oxide layer to laterally etch the oxidized sacrificial support and to remove the oxidized sacrificial support. A MEMS structure with anti-stiction bumps is also provided.

20 Claims, 8 Drawing Sheets

(56) References Cited

U.S. PATENT DOCUMENTS

| | | | |
|---|---|---|---|
| 2006/0180882 A1* | 8/2006 | Sato | B81C 1/00587 257/414 |
| 2006/0246631 A1* | 11/2006 | Lutz | B81B 3/0005 438/127 |
| 2009/0111267 A1* | 4/2009 | Park | B81B 3/001 438/692 |
| 2012/0107992 A1* | 5/2012 | Karlin | B81B 3/001 438/50 |
| 2012/0181637 A1* | 7/2012 | Shu | B81B 3/001 257/415 |
| 2012/0280591 A1* | 11/2012 | Schultz | B81B 3/0016 310/300 |
| 2012/0288683 A1* | 11/2012 | Kuo | H01L 21/0337 428/172 |
| 2012/0319527 A1* | 12/2012 | Jahnes | B81B 3/001 310/300 |
| 2012/0319528 A1* | 12/2012 | Jahnes | B81B 3/001 310/300 |
| 2013/0015743 A1 | 1/2013 | Tsai et al. | |
| 2013/0032904 A1 | 2/2013 | Feyh et al. | |
| 2014/0001583 A1 | 1/2014 | Teh et al. | |
| 2014/0084395 A1* | 3/2014 | Sparks | G01L 9/008 257/416 |
| 2014/0353774 A1 | 12/2014 | Zhang et al. | |
| 2015/0076632 A9* | 3/2015 | Murarka | B81C 1/00158 257/419 |
| 2015/0289073 A1 | 10/2015 | Salvia et al. | |

OTHER PUBLICATIONS

Final Office Action dated Dec. 2, 2016 for U.S. Appl. No. 14/699,070.
Notice of Allowance dated Feb. 7, 2017 for U.S. Appl. No. 14/699,070.

* cited by examiner

MICROELECTROMECHANICAL SYSTEMS (MEMS) STRUCTURE TO PREVENT STICTION AFTER A WET CLEANING PROCESS

REFERENCE TO RELATED APPLICATION

This Application is a Divisional of U.S. application Ser. No. 14/699,070, filed on Apr. 29, 2015, the contents of which are hereby incorporated by reference in their entirety.

BACKGROUND

Microelectromechanical systems (MEMS) devices, such as accelerometers, pressure sensors, and microphones, have found widespread use in many modern day electronic devices. For example, MEMS accelerometers are commonly found in automobiles (e.g., in airbag deployment systems), tablet computers, or in smart phones. For many applications, MEMS devices are electrically connected to application-specific integrated circuits (ASICs) to form complete MEMS systems.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
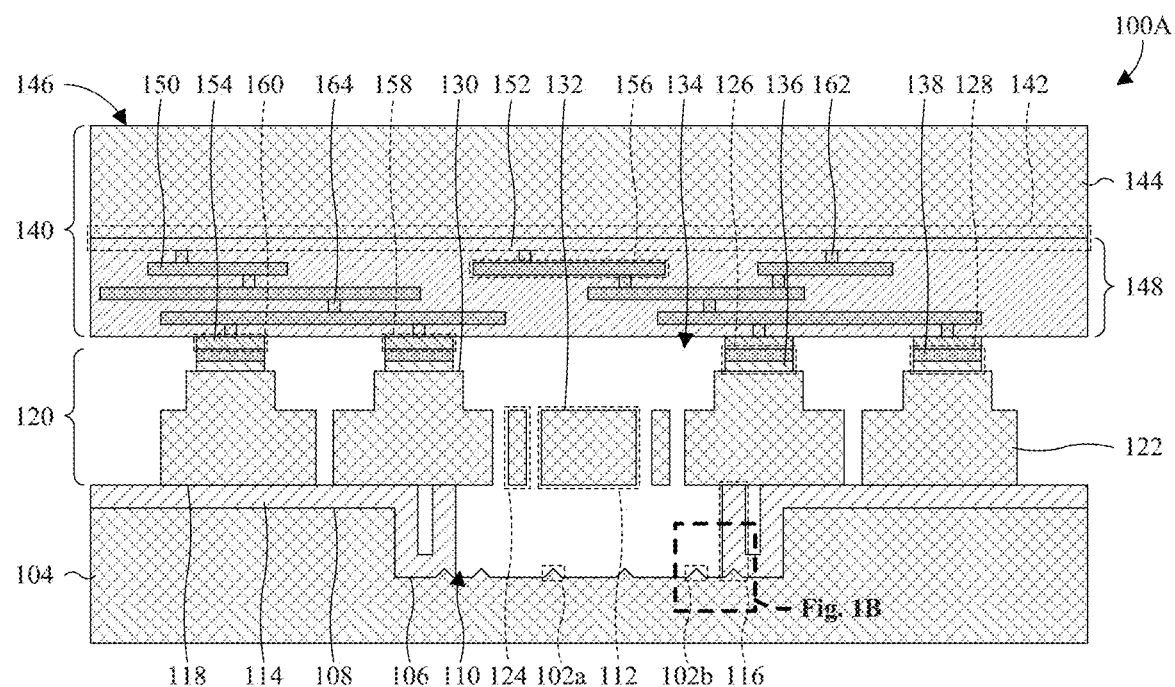
FIG. 1A illustrates a cross-sectional view of some embodiments of a microelectromechanical systems (MEMS) structure with anti-stiction bumps.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

According to some methods for a manufacturing microelectromechanical systems (MEMS) device, a first etch is performed into an upper surface of a carrier substrate to form a cavity, and a dielectric layer is formed lining the upper surface and the cavity. A MEMS substrate is then fusion bonded to the carrier substrate through the dielectric layer. Further, a second etch is performed into the MEMS substrate to form the MEMS device with a movable mass overlying the cavity. With the movable mass formed, a cleaning process (e.g., a wet cleaning process) is performed to remove residual material from the second etch. However, the cleaning process may cause the movable mass to stick to a neighboring surface in the X, Y, or Z direction. Such stiction, in turn, reduces yields by, for example, about 5%.

In view of the foregoing, the present disclosure is directed to a method for manufacturing a MEMS device with a sacrificial support to prevent stiction, as well as the resulting MEMS structure. According to the method, a first etch is performed into an upper surface of a carrier substrate to form a cavity, and to form the sacrificial support and a sacrificial barrier in the cavity. A thermal oxidation process is performed to oxidize the sacrificial support and the sacrificial barrier, and to form an oxide layer lining the upper surface and including the oxidized sacrificial support and the oxidized sacrificial barrier. A MEMS substrate is fusion bonded to the carrier substrate through the oxide layer, and a second etch is performed into the MEMS substrate to form the MEMS device with a movable mass overlying the cavity and supported by the oxidized sacrificial support. With the movable mass formed, a cleaning process is performed to remove residual material from the second etch, and a third etch is performed into the oxide layer between the oxidized sacrificial support and the oxidized sacrificial barrier. The third etch laterally etches the oxide layer, and removes the oxidized sacrificial support and at least part of the oxidized sacrificial barrier, to release the movable mass.

Advantageously, during the cleaning process, the oxidized sacrificial support prevents the movable mass from sticking to a lower surface of the cavity, and prevents other stiction of the movable mass in the X, Y, and Z directions. This, in turn, increases yields. Further, the oxidized sacrificial barrier advantageously protects the fusion bond around the edge of the cavity during the third etch. By protecting the fusion bond during the third etch, yields are further improved. Even more, the thermal oxidation process advantageously leaves anti-stiction bumps in the carrier substrate along the lower surface of the cavity, and under the oxidized sacrificial support and the oxidized sacrificial barrier. During the third etch, these anti-stiction bumps are exposed, and subsequently act as stoppers for the movable mass. The anti-stiction bumps have profiles culminating in points, and therefore reduce the surface area for the movable mass to stick to and the likelihood of stiction.

With reference to FIG. 1A, a cross-sectional view 100A of some embodiments of a MEMS structure with anti-stiction bumps 102a, 102b is provided. The anti-stiction bumps 102a, 102b are integrated into a carrier substrate 104, and arranged along a surface 106 of the carrier substrate 104 that is recessed relative to an upper surface 108 of the carrier substrate 104. Further, the anti-stiction bumps 102a, 102b protrude into a lower cavity 110 defined over the carrier substrate 104. The anti-stiction bumps 102a, 102b include one or more central anti-stiction bumps 102a arranged within a central region of the lower cavity 110, and/or one or more peripheral anti-stiction bumps 102b arranged at a periphery region of the lower cavity 110 that is laterally positioned between the central region of the lower cavity 110 and sidewalls of the lower cavity 110. In some embodiments, the central anti-stiction bump(s) 102a are line shaped (not visible in the cross-sectional view 100A) and extend in parallel, and/or the peripheral anti-stiction bump(s) 102b are ring-shaped and arranged around the central anti-stiction bumps 102a. As seen hereafter, the anti-stiction bumps 102a, 102b are a by-product of the method used to form the MEMS structure, and advantageously act as stoppers to reduce stiction between the recessed surface 106 of the carrier substrate 104 and a movable mass 112 overlying the lower cavity 110. The carrier substrate 104 may be, for example, a bulk semiconductor substrate, such as a bulk silicon substrate, or a silicon-on-insulator (SOI) substrate.

A dielectric layer 114 lines the upper surface 108 of the carrier substrate 104 around the lower cavity 110, and lines sidewalls of the carrier substrate 104 that are arranged in the lower cavity 110. Further, the dielectric layer 114 lines the recessed surface 106 of the carrier substrate 104 around the periphery of the lower cavity 110. In some embodiments, the dielectric layer 114 has a thickness of about 1 micrometer to about 2.5 micrometers. Further, in some embodiments, the dielectric layer 114 includes one or more sacrificial barriers 116. The sacrificial barrier(s) 116 are arranged over one or more of protrusions of the carrier substrate 104 extending outward from the recessed surface 106 of the carrier substrate 104. For example, in some embodiments, the sacrificial barrier(s) 116 may be arranged over one or more of the peripheral anti-stiction bump(s) 102b at a periphery of the lower cavity 110. The sacrificial barrier(s) 116 vertically extend from the recessed surface 106 of the carrier substrate 104 to about even with an upper surface 118 of the dielectric layer 114. The sacrificial barrier(s) 116 are typically ring-shaped shaped (not visible in the cross-sectional view 100A) and extend around the periphery of the lower cavity 110. As seen hereafter, the sacrificial barrier(s) 116 advantageously protect the interface between the dielectric layer 114 and an overlying MEMS device 120 during manufacture of the MEMS structure.

The MEMS device 120 is arranged over the dielectric layer 114 and the carrier substrate 104, and is bonded to the carrier substrate 104 through the dielectric layer 114. The MEMS device 120 may be, for example, a motion sensor, a pressure sensor, or a microphone, and includes a MEMS substrate 122. The MEMS substrate 122 may be, for example, a bulk semiconductor substrate, such as a bulk silicon substrate, a SOI substrate, or a polysilicon-on-insulator (POI) substrate. In some embodiments, the MEMS substrate 122 may include one or more springs 124 and the movable mass 112. The spring(s) 124 connect the movable mass 112 to a peripheral region of the MEMS substrate 122, and suspend the movable mass 112 over the lower cavity 110 and the central anti-stiction bump(s) 102a between the peripheral anti-stiction bump(s) 102b (i.e., so that the movable mass 112 is laterally offset from the peripheral anti-stiction bump(s) 102b). In operation, the movable mass 112 deflects in proportion to external stimuli, such as motion or sound waves, applied to the movable mass 112, whereby the external stimuli can be quantified by measuring the deflection. In some embodiments, the deflection is measured using capacitive coupling between a movable sensing electrode (not shown) supported by the movable mass 112 and a fixed sensing electrode (not shown) neighboring the movable sensing electrode.

One or more MEMS bond pads 126 and a MEMS bond ring 128 are arranged over the MEMS substrate 122. In some embodiments, the MEMS bond pad(s) 126 and the MEMS bond ring 128 are arranged over upper surfaces 130 of the MEMS substrate 122 that are elevated relative to an upper surface 132 of the movable mass 112. The MEMS bond ring 128 surrounds an upper cavity 134 defined over the movable mass 112, and typically surrounds the MEMS bond pad(s) 126. The MEMS bond pad(s) 126 are electrically coupled to conductors, such as the movable sensing electrode, and/or electrical circuits arranged within the MEMS substrate 122 and/or underlying the MEMS substrate 122. The MEMS bond ring 128 and the MEMS bond pad(s) 126 are arranged within one or more bonding layers 136, 138. The bonding layer(s) 136, 138 may be, for example, aluminum, copper, aluminum copper, or germanium.

An integrated circuit (IC) 140 is arranged over the MEMS device 120 and the upper cavity 134, and bonded to the MEMS device 120. The IC 140 supports MEMS operations and may be, for example, an application-specific-integrated circuit (ASIC). The IC 140 includes a device region 142 arranged in an IC substrate 144 of the IC 140 between a backside 146 of the IC 140 and a back-end-of-line (BEOL) metallization stack 148 of the IC 140. The device region 142 includes electronic components (not shown), such as, for example, one or more of transistors, capacitors, resistors, inductors, and diodes. The IC substrate 144 may be, for example, a bulk semiconductor substrate or a SOI substrate.

The BEOL metallization stack 148 includes intra-dielectric metallization layers 150 stacked within an interlayer dielectric (ILD) layer 152, and an extra-dielectric metallization layer 154 arranged on the ILD layer 152, opposite the IC substrate 144. The intra-dielectric metallization layers 150 include metal lines 156, and the extra-dielectric metallization layer 154 includes one or more IC bond pads 158 and an IC bond ring 160. The IC bond pad(s) 158 and the IC bond ring 160 typically align vertically with the MEMS bond pad(s) 126 and the MEMS bond ring 128, and bond the IC 140 to the MEMS device 120 therethrough. Contacts 162 of the BEOL metallization stack 148 extend from an intra-dielectric metallization layer 150 to the device region 142. Further, vias 164 of the BEOL metallization stack 148 extend between the intra- and extra-dielectric metallization layers 150, 154 to interconnect the metallization layers 150, 154. The ILD layer 152 may be, for example, a low κ dielectric (i.e., a dielectric with a dielectric constant less than about 3.9) or an oxide. The metallization layers 150, 154, the contacts 162, and the vias 164 may be, for example, aluminum copper or germanium.

Figure 1B:
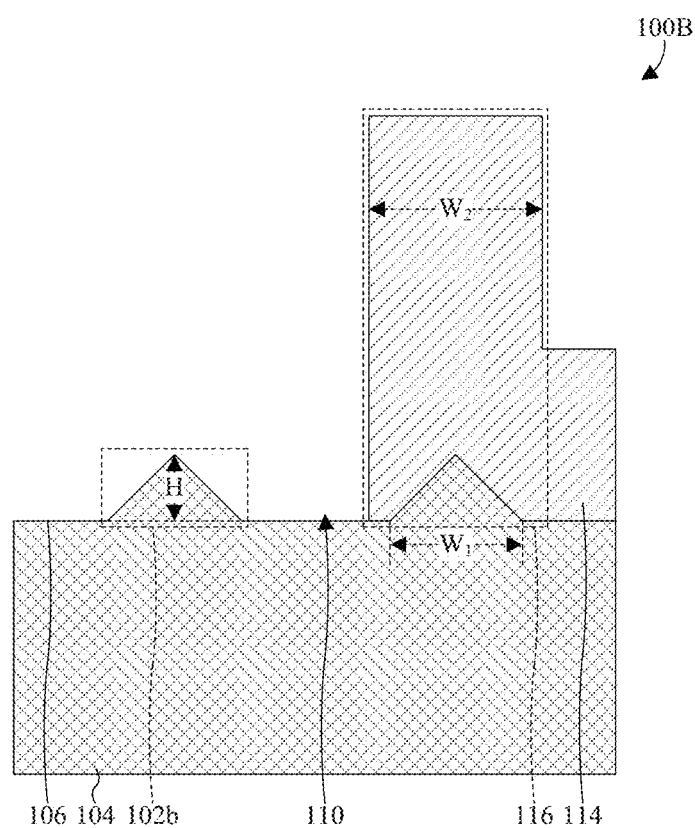
FIG. 1B illustrates an enlarged cross-sectional view of some embodiments of the MEMS structure of FIG. 1A.

With reference to FIG. 1B, an enlarged cross-sectional view 100B of some embodiments of the MEMS structure of FIG. 1A is provided. As illustrated, the anti-stiction bumps 102a, 102b of the carrier substrate 104 have widths tapering into the lower cavity 110. For example, the anti-stiction bumps 102a, 102b may have a triangular profile or a semicircular profile. Because the anti-stiction bumps 102a, 102b have tapering widths into the lower cavity 110, the anti-stiction bumps 102a, 102b reduce the surface area for the movable mass 112 (see FIG. 1A) to stick to, and hence reduce the likelihood of stiction. Further, the anti-stiction bumps 102a, 102b have a height H and a width $W_1$. The height H of the anti-stiction bumps 102a, 102b may be, for example, about 1 micrometer to about 2 micrometers, or about 1 micrometer to about 2.5 micrometers. The width $W_1$ of the anti-stiction bumps 102a, 102b may be, for example, about 2 to about 4 micrometers, or about 1 to about 5 micrometers.

Also illustrated, the sacrificial barrier(s) 116 are arranged over corresponding anti-stiction bumps and have a width $W_2$. The width $W_2$ of the sacrificial barrier(s) 116 is typically about twice the width $W_1$ of the anti-stiction bumps 102a, 102b. For example, the width $W_2$ of the sacrificial barrier(s) 116 may be, for example, about 4 to about 8 micrometers.

Figure 2:
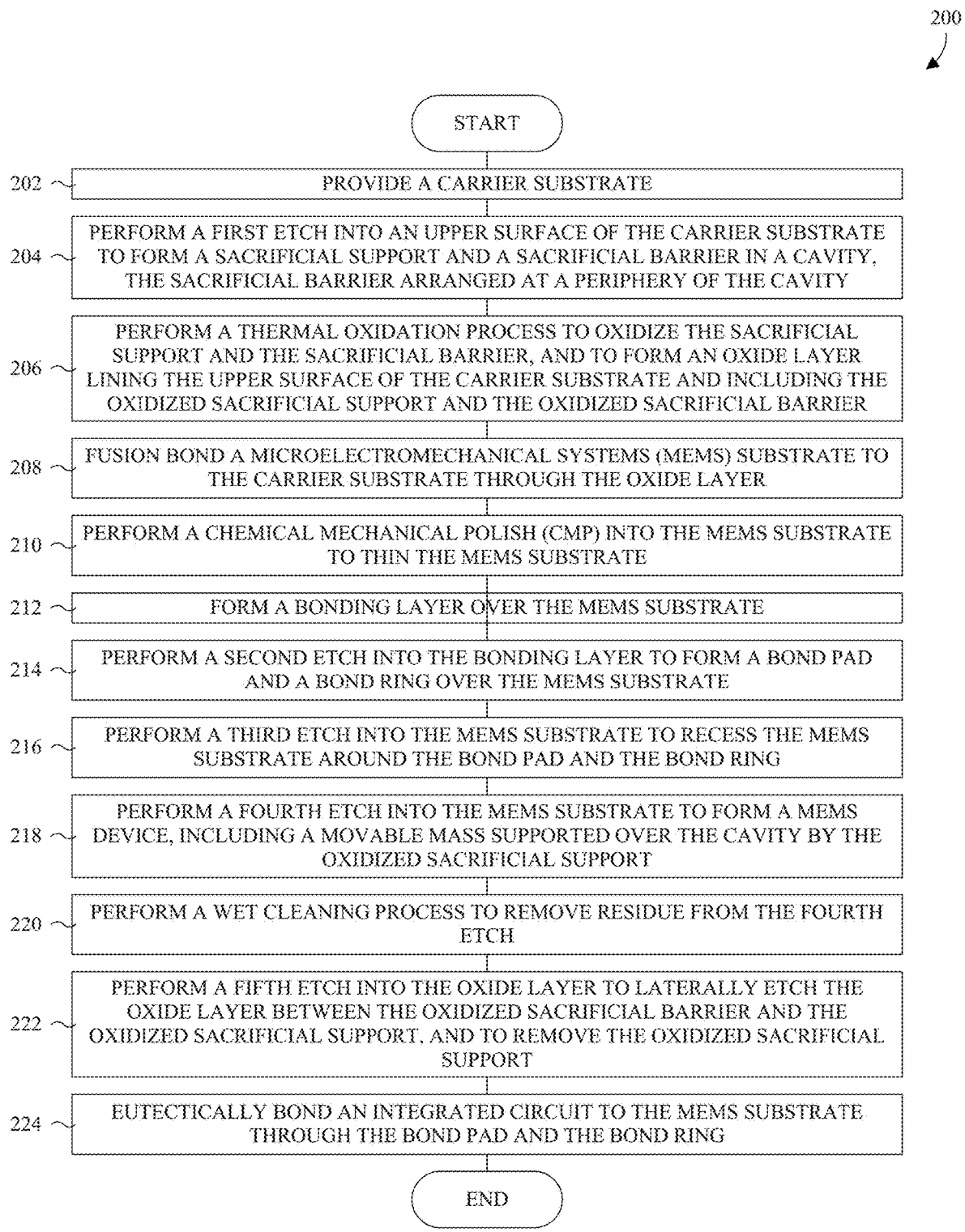
FIG. 2 illustrates a flow chart of some embodiments of a method for manufacturing a MEMS structure with sacrificial supports to prevent stiction.

With reference to FIG. 2, a flowchart 200 of some embodiments of a method for manufacturing a MEMS structure with a sacrificial support to prevent stiction is provided.

At 202, a carrier substrate is provided.

At 204, a first etch is performed into an upper surface of the carrier substrate to form a sacrificial support and a sacrificial barrier in a cavity. The sacrificial barrier is arranged at a periphery of the cavity around the sacrificial support.

At 206, a thermal oxidation process is performed to oxidize the sacrificial support and the sacrificial barrier. Further, the thermal oxidation process is performed to form an oxide layer lining the upper surface of the carrier substrate, and including the oxidized sacrificial support and the oxidized sacrificial barrier. Advantageously, the thermal oxidation process results in anti-stiction bumps along a lower surface of the cavity.

At 208, a MEMS substrate is fusion bonded to the carrier substrate through the oxide layer.

At 210, a chemical mechanical polish (CMP) is performed into the MEMS substrate to thin the MEMS substrate.

At 212, a bonding layer is formed over the MEMS substrate.

At 214, a second etch is performed into the bonding layer to form a bond pad and a bond ring over the MEMS substrate.

At 216, a third etch is performed into the MEMS substrate to recess the MEMS substrate around the bond pad and the bond ring.

At 218, a fourth etch is performed into the MEMS substrate to form a MEMS device, including a movable mass supported over the cavity by the oxidized sacrificial support.

At 220, a wet cleaning process is performed to remove residue from the fourth etch. Advantageously, the support structure fixes the position of the movable mass during the wet cleaning process, thereby preventing stiction in the X, Y, and Z directions during the wet cleaning process.

At 222, a fifth etch is performed into the oxide layer to laterally etch the oxide layer between the oxidized sacrificial barrier and the oxidized sacrificial support, and to remove the oxidized sacrificial support. Advantageously, the oxidized sacrificial barrier protects the fusion bond around the edge of the cavity while laterally etching away the oxidized sacrificial support.

At 224, an integrated circuit is eutectically bonded to the MEMS substrate through the bond pad and the bond ring.

While the method described by the flowchart 200 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

With reference to FIGS. 3-14, cross-sectional views of some embodiments of a MEMS structure at various stages of manufacture are provided to illustrate the method of FIG. 2. Although FIGS. 3-14 are described in relation to the methods, it will be appreciated that the structures disclosed in FIGS. 3-14 are not limited to the methods, but instead may stand alone as structures independent of the methods. Similarly, although the methods are described in relation to FIGS. 3-14, it will be appreciated that the methods are not limited to the structures disclosed in FIGS. 3-14, but instead may stand alone independent of the structures disclosed in FIGS. 3-14.

Figure 3:
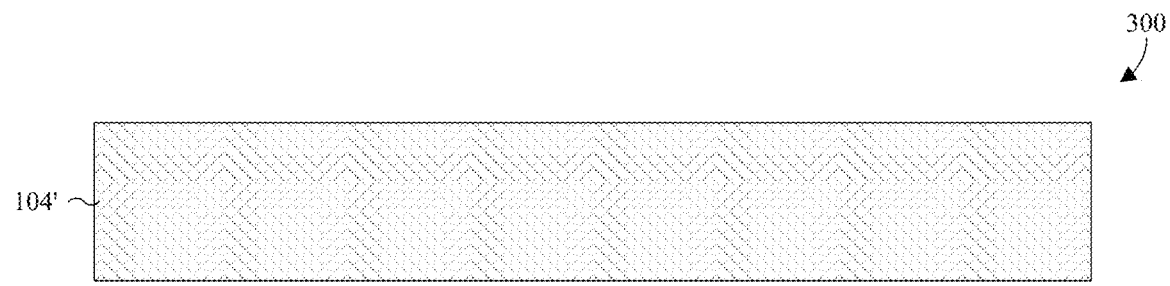
FIGS. 3-14 illustrate a series of cross-sectional views of some embodiments of a MEMS structure at various stages of manufacture according to the method of FIG. 2.

FIG. 3 illustrates a cross-sectional view 300 of some embodiments corresponding to Act 202. As illustrated, a carrier substrate 104' is provided. The carrier substrate 104' may be, for example, a bulk semiconductor substrate, such as a bulk silicon substrate, or a SOI substrate.

Figure 4:
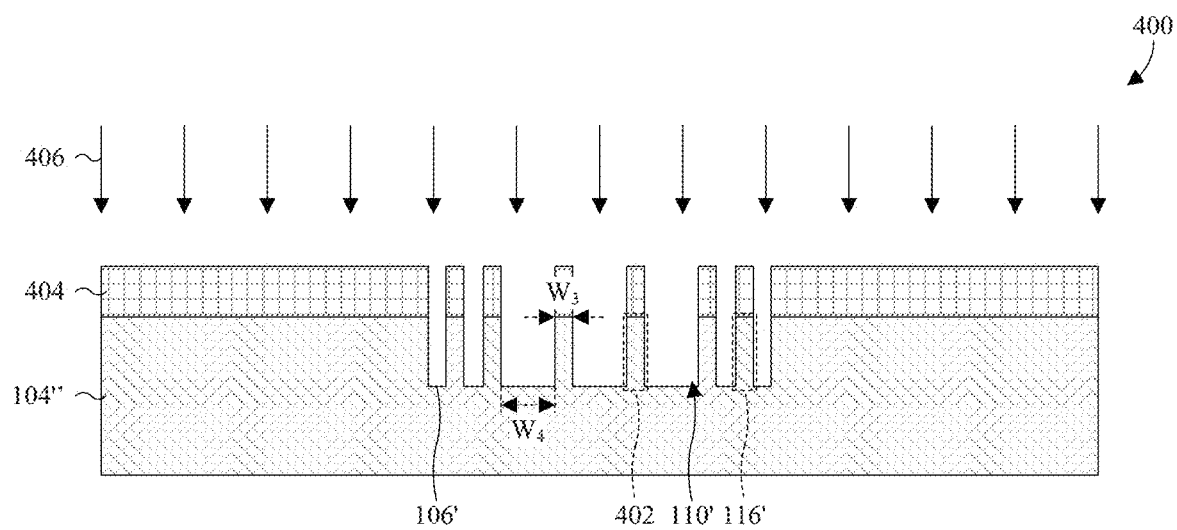

FIG. 4 illustrates a cross-sectional view 400 of some embodiments corresponding to Act 204. As illustrated, a first etch is performed into the carrier substrate 104' (see FIG. 3) to form a lower cavity 110', and to form one or more sacrificial supports 402 and one or more sacrificial barriers 116' in the lower cavity 110'. The sacrificial support(s) 402 and the sacrificial barrier(s) 116' extend into the lower cavity 110' from a lower surface 106' of the lower cavity 110'. In some embodiments, the sacrificial support(s) 402 and/or the sacrificial barrier(s) 116' have widths $W_3$ of about 2 to about 4 micrometers. Further, in some embodiments, the sacrificial support(s) 402 are line shaped (not visible in the cross-sectional view 400) and extend in parallel, and/or the sacrificial barrier(s) 116' are ring-shaped (not visible in the cross-sectional view 400) and surround the sacrificial support(s) 402. The sacrificial support(s) 402 are typically arranged within a central region of the lower cavity 110', and the sacrificial barrier(s) 116' are typically arranged along a peripheral region of the lower cavity 110' that is laterally positioned between the central region of the lower cavity 110' and sidewalls of the lower cavity 110'. For example, the sacrificial barrier(s) 116' may include a pair of sacrificial barriers arranged on opposing sides of the sacrificial support(s) 402. In some embodiments, a width $W_4$ of the space intermediate the sacrificial support(s) 402 and the sacrificial barrier(s) 116' is about 2 micrometers to about 50 micrometers.

The process for performing the first etch may include forming a first photoresist layer 404 selectively masking the carrier substrate 104'. An etchant 406 may then be applied to the carrier substrate 104' according to a pattern of the first photoresist layer 404, thereby forming the sacrificial support(s) 402 and the sacrificial barrier(s) 116' in the lower cavity 110'. After applying the etchant 406, the first photoresist layer 404 may be removed.

Figure 5:
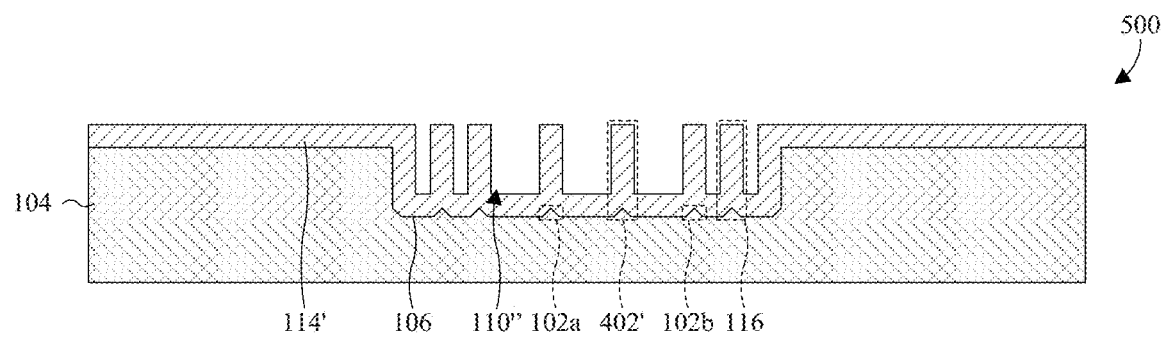

FIG. 5 illustrates a cross-sectional view 500 of some embodiments corresponding to Act 206. As illustrated, a thermal oxidation process is performed on the MEMS structure. The thermal oxidation process may be performed by, for example, exposing the MEMS structure to an oxidizing agent under elevated temperatures.

The thermal oxidation process oxidizes exposed regions of the remaining carrier substrate 104" (see FIG. 4), including the sacrificial support(s) 402 (see FIG. 4) and the sacrificial barrier(s) 116' (see FIG. 4), to form an oxide layer 114'. In some embodiments, the oxide layer 114' has a thickness of about 1 micrometer to about 2.5 micrometers.

The oxide layer 114' is arranged over the remaining carrier substrate 104, lines the remaining lower cavity 110", and includes the oxidized sacrificial support(s) 402' and the oxidized sacrificial barrier(s) 116. Typically, the thermal oxidation process about doubles the widths of the sacrificial support(s) 402 and the sacrificial barrier(s) 116'. For example, the oxidized sacrificial support(s) 402' and/or the oxidized sacrificial barrier(s) 116 may have widths of about 4 about 8 micrometers.

Further, the thermal oxidation process forms anti-stiction bumps 102a, 102b underlying the oxidized sacrificial support(s) 402' and the oxidized sacrificial barrier(s) 116. The anti-stiction bumps 102a, 102b include one or more central anti-stiction bumps 102a arranged at a center of the remaining lower cavity 110" under the oxidized sacrificial support(s) 402'. Further, the anti-stiction bumps 102a, 102b include one or more peripheral anti-stiction bumps 102b arranged at a periphery of the remaining lower cavity 110" under the oxidized sacrificial barriers(s) 116. The anti-stiction bumps 102a, 102b have widths tapering into the remaining lower cavity 110", and typically have a triangular profile or a semicircular profile. In some embodiments, the anti-stiction bumps 102a, 102b have a height of about 1 micrometer to about 2 micrometers, and/or have a width of about 2 to about 4 micrometers. As described above, the anti-stiction bumps 102a, 102b advantageously serve as stoppers for a movable mass to be formed over the anti-stiction bumps 102a, 102b.

Figure 6:
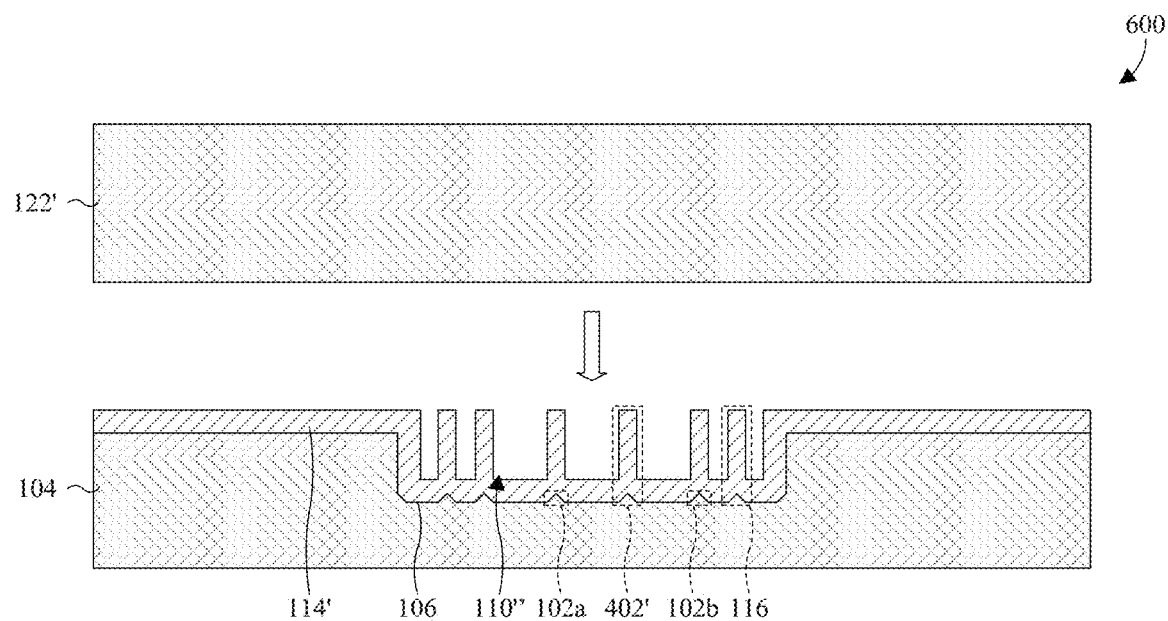

FIG. 6 illustrates a cross-sectional view 600 of some embodiments corresponding to Act 208. As illustrated, a MEMS substrate 122' is bonded to the remaining carrier substrate 104 through the oxide layer 114', typically by fusion bonding. The MEMS substrate 122' may be, for example, a bulk semiconductor substrate, such as a bulk silicon substrate, a SOI substrate, or a POI substrate.

Figure 7:
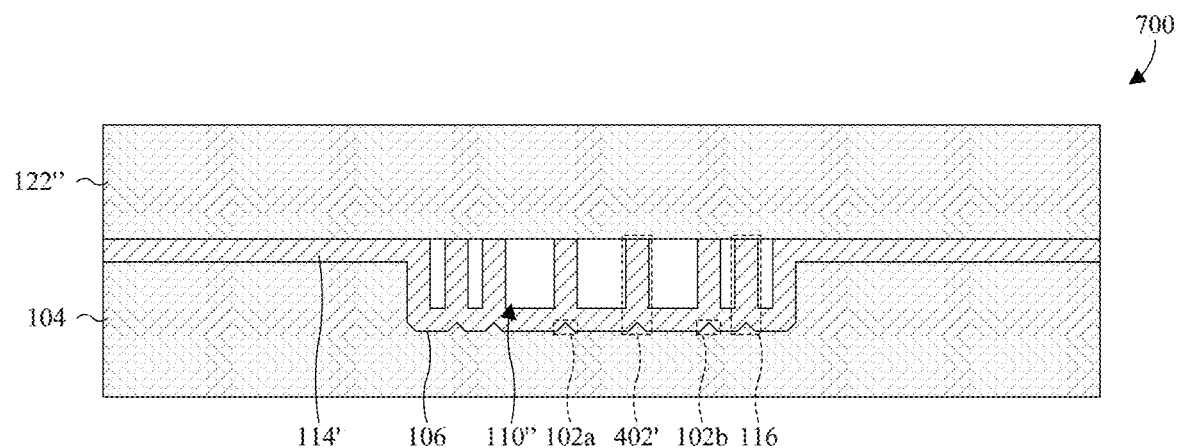

FIG. 7 illustrates a cross-sectional view 700 of some embodiments corresponding to Act 210. As illustrated, a CMP is performed into the MEMS substrate 122' (see FIG. 6) to reduce a thickness of the MEMS substrate 122'. For example, the thickness of the MEMS substrate 122' may be reduced to about 30 micrometers. In some embodiments, an etch back is additionally or alternatively performed.

Figure 8:
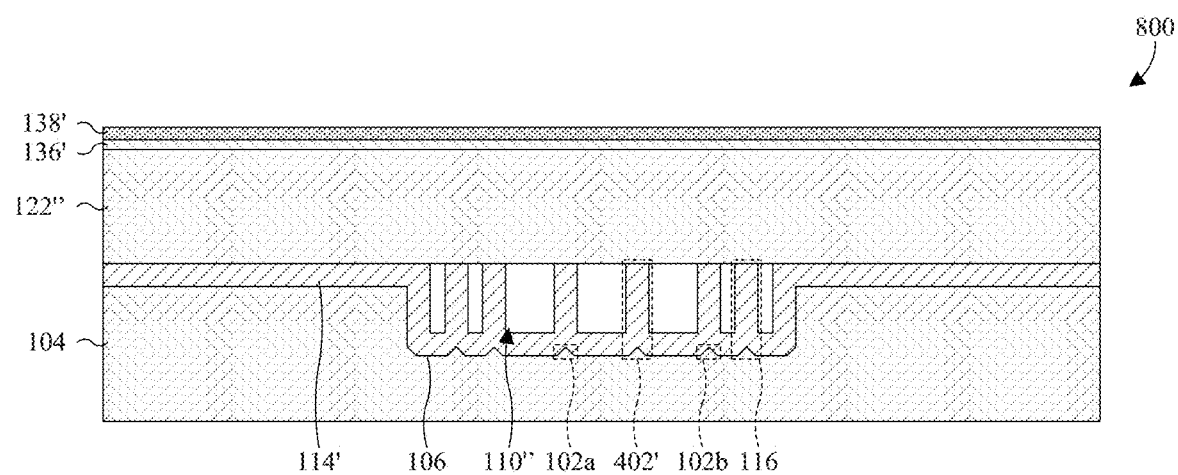

FIG. 8 illustrates a cross-sectional view 800 of some embodiments corresponding to Act 212. As illustrated, one or more bonding layers 136', 138' are formed stacked over the remaining MEMS substrate 122". The one or more bonding layers 136', 138' may be formed using a deposition process such as spin coating a vapor deposition. Further, the bonding layer(s) 136', 138' may be formed of, for example, aluminum, copper, aluminum copper, or germanium.

Figure 9:
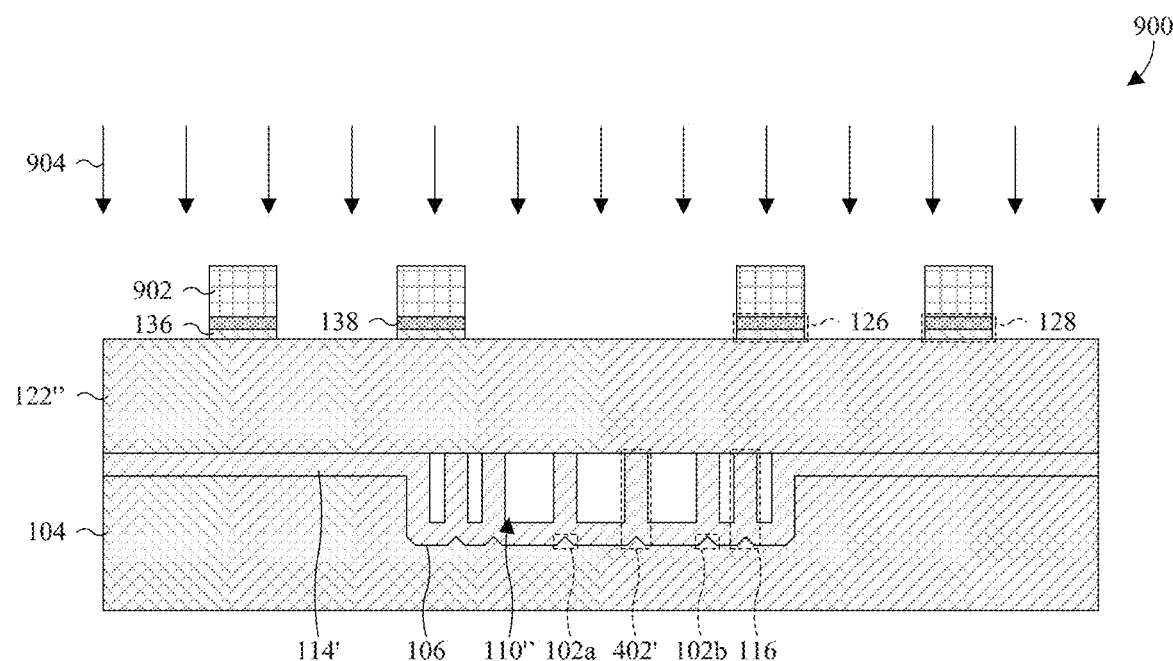

FIG. 9 illustrates a cross-sectional view 900 of some embodiments corresponding to Act 214. As illustrated, a second etch is performed into the bonding layer(s) 136', 138' (see FIG. 8) to form one or more MEMS bond pads 126 and a MEMS bond ring 128 over the remaining MEMS substrate 122". The MEMS bond ring 128 surrounds the remaining lower cavity 110", and typically surrounds the MEMS bond pad(s) 126. In some embodiments, the MEMS bond pad(s) 126 are electrically coupled to conductors and/or electrical circuits arranged within the remaining MEMS substrate 122" and/or underlying the remaining MEMS substrate 122".

The process for performing the second etch may include forming a second photoresist layer 902 selectively masking the bonding layer(s) 136', 138'. An etchant 904 may then be applied to the bonding layer(s) 136', 138' according to a pattern of the second photoresist layer 902, thereby forming the MEMS bond pad(s) 126 and the MEMS bond ring 128. After applying the etchant 904, the second photoresist layer 902 may be removed.

Figure 10:
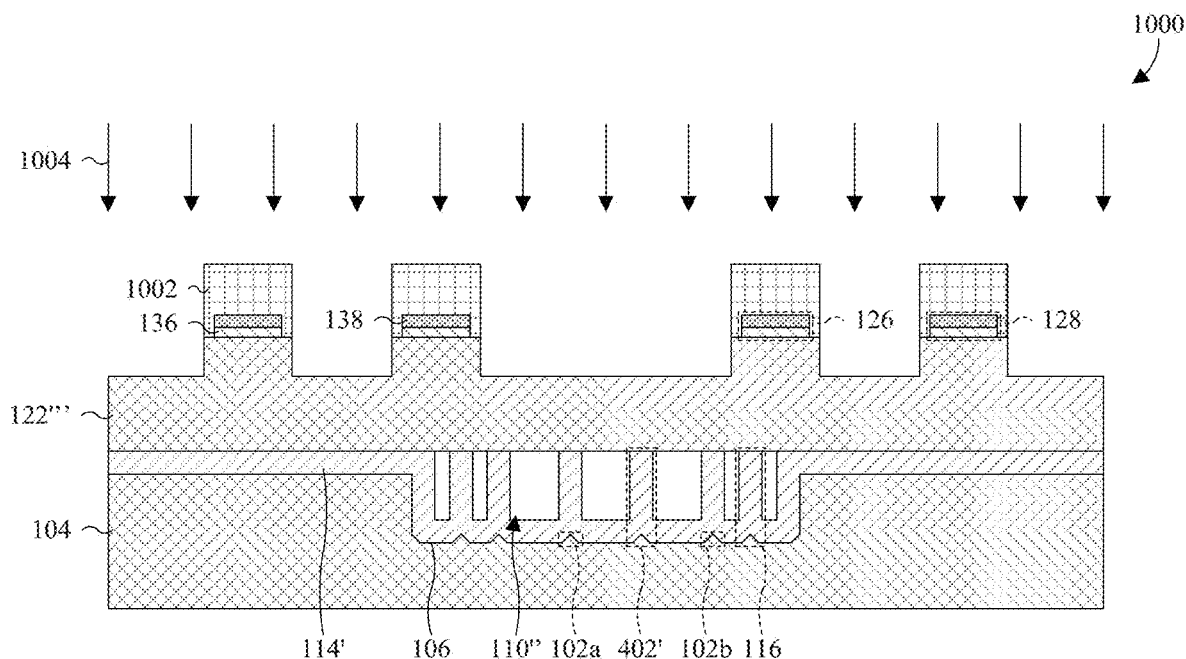

FIG. 10 illustrates a cross-sectional view 1000 of some embodiments corresponding to Act 216. As illustrated, a third etch is performed into the remaining MEMS substrate 122" (see FIG. 9) to recess the remaining MEMS substrate 122" around the MEMS bond pad(s) 126 and the MEMS bond ring 128.

The process for performing the third etch may include forming a third photoresist layer 1002 selectively masking the MEMS bond pad(s) 126 and the MEMS bond ring 128. An etchant 1004 may then be applied to the remaining MEMS substrate 122" according to a pattern of the third photoresist layer 1002. After applying the etchant 1004, the third photoresist layer 1002 may be removed.

Figure 11:
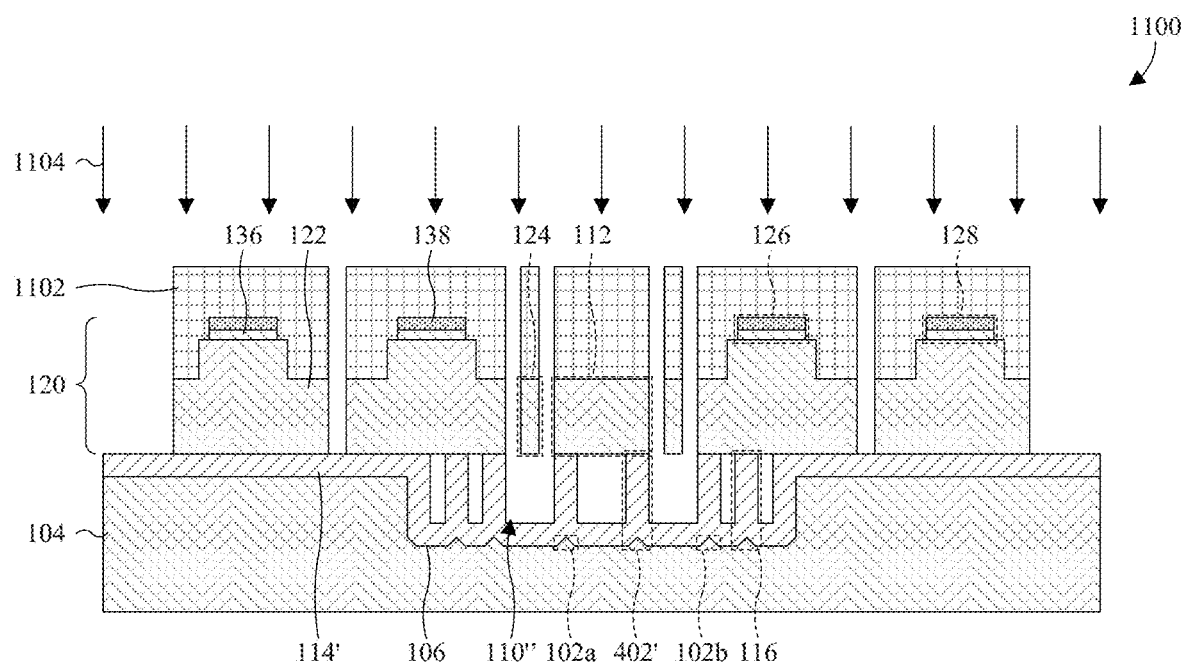

FIG. 11 illustrates a cross-sectional view 1100 of some embodiments corresponding to Act 218. As illustrated, a fourth etch is performed into the remaining MEMS substrate 122''' (see FIG. 10) to form a MEMS device 120, including a movable mass 112 supported over the c by the oxidized sacrificial support(s) 402' and one or more springs 124. Advantageously, the oxidized sacrificial support(s) 402' prevent the movable mass 112 from undergoing movement in the X, Y, or Z directions, thereby preventing stiction.

The process for performing the fourth etch may include forming a fourth photoresist layer 1102 selectively masking the remaining MEMS substrate 122'''. An etchant 1104 may then be applied to the remaining MEMS substrate 122''' according to a pattern of the fourth photoresist layer 1102. After applying the etchant 1104, the fourth photoresist layer 1102 may be removed.

Figure 12:
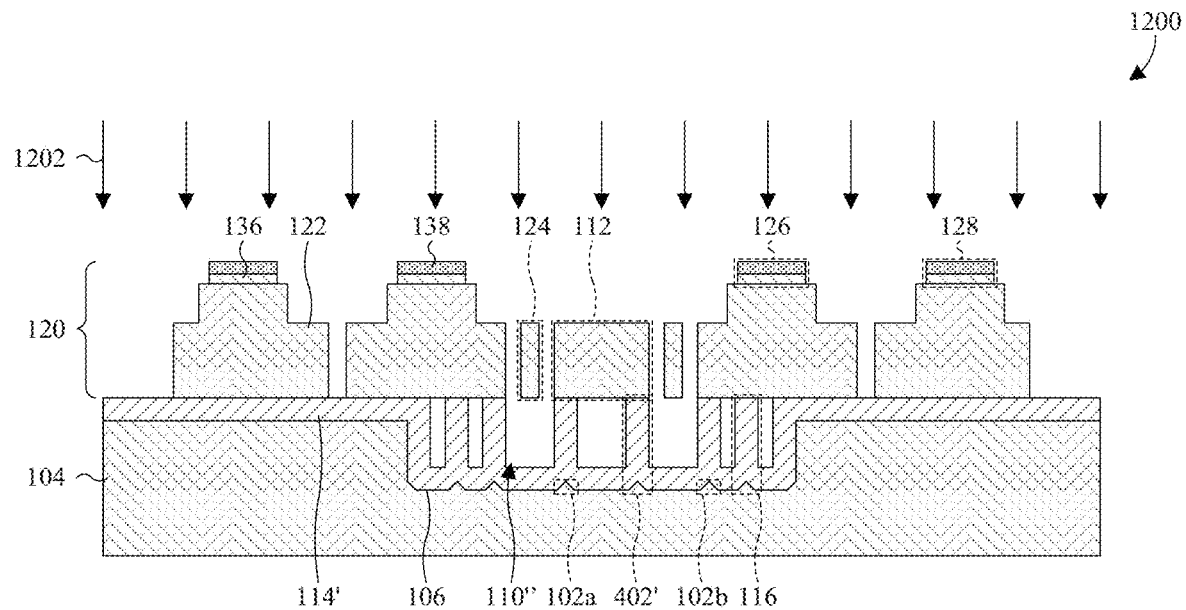

FIG. 12 illustrates a cross-sectional view 1200 of some embodiments corresponding to Act 220. As illustrated, a cleaning process is performed to remove residue from the fourth etch. The cleaning process is typically a wet cleaning process, and may include, for example, applying a wet cleaning solution 1202 to the MEMS structure. Advantageously, the oxidized sacrificial support(s) 402' prevent stiction of the movable mass 112 during the cleaning process.

Figure 13:
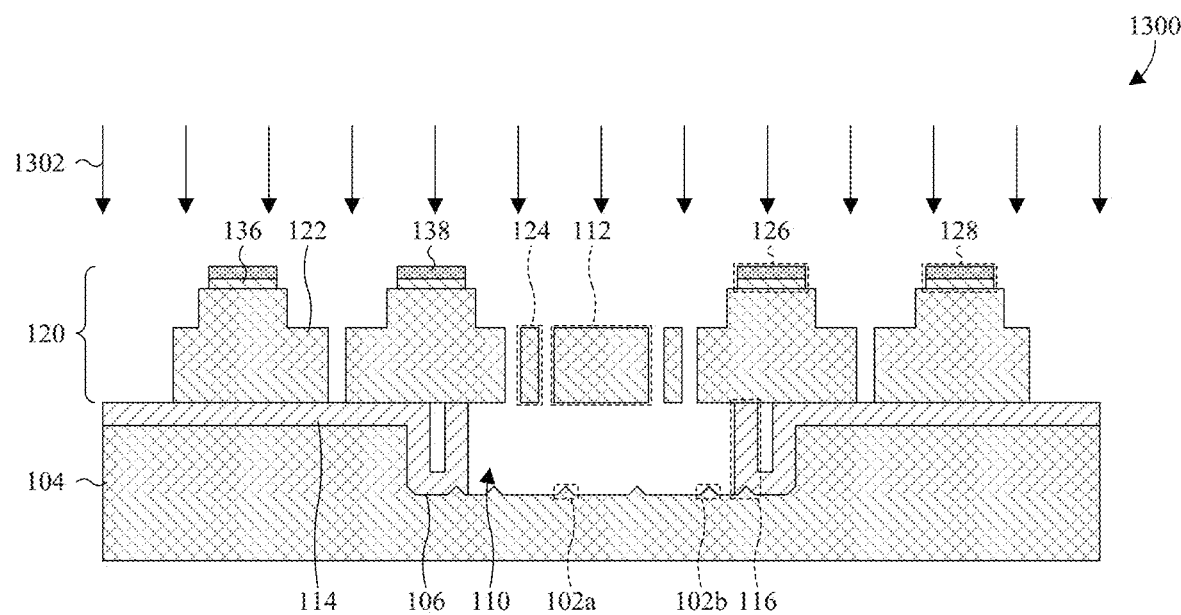

FIG. 13 illustrates a cross-sectional view 1300 of some embodiments corresponding to Act 222. As illustrated, a fifth etch is performed into the oxide layer 114' (see FIG. 12) by exposing the oxide layer 114' to an etchant 1302 between the oxidized sacrificial support(s) 402' (see FIG. 12) and the oxidized sacrificial barrier(s) 116. Typically, the etchant 1302 is a vapor hydrofluoric acid (VHF).

The fifth etch laterally etches the oxide layer 114' to remove the oxidized sacrificial support(s) 402', and to expose the central anti-stiction bump(s) 102a underlying the movable mass 112. By removing the oxidized sacrificial support(s) 402', the movable mass 112 is released and becomes movable. Further, the fifth etch at least partially removes the oxidized sacrificial barrier(s) 116 to at least partially expose the periphery anti-stiction bump(s) 102b. The extent to which the oxidized sacrificial barrier(s) 116 are removed may be controlled by the over etch percentage for the oxidized sacrificial support(s) 402'. The oxidized sacrificial barrier(s) 116 are sacrificed to protect the bond interface between the MEMS device 120 and the remaining carrier substrate 104 around the edge of the remaining lower cavity 110". This, in turn, may increase yield by improving the strength of the MEMS structure.

Figure 14:
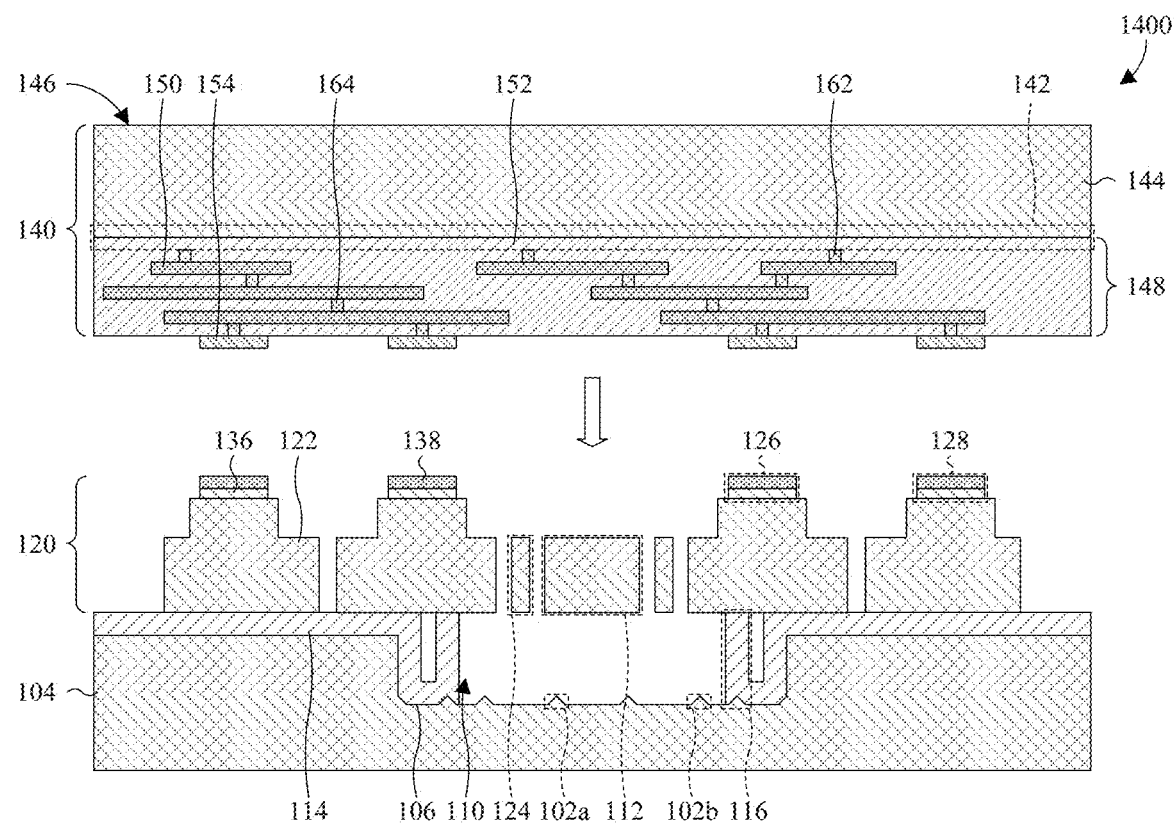

FIG. 14 illustrates a cross-sectional view 1400 of some embodiments corresponding to Act 224. As illustrated, an IC 140 is arranged over the MEMS device 120 and bonded to the MEMS device 120. Typically, the IC 140 is eutectically bonded to the MEMS device 120 through the MEMS bond pad(s) 126 and the MEMS bond ring 128.

The IC 140 includes a device region 142 arranged in an IC substrate 144 of the IC 140 between a backside 146 of the IC 140 and a back-end-of-line (BEOL) metallization stack 148 of the IC 140. The device region 142 includes electronic components (not shown), such as, for example, one or more of transistors, capacitors, resistors, inductors, and diodes. The IC substrate 144 may be, for example, a bulk semiconductor substrate or a SOI substrate. The BEOL metallization stack 148 includes intra-dielectric metallization layers 150 stacked within an ILD layer 152, and an extra-dielectric metallization layer 154 arranged on the ILD layer 152, opposite the IC substrate 144. Contacts 162 of the BEOL metallization stack 148 extend from an intra-dielectric metallization layer 150 to the device region 142. Further, vias 164 of the BEOL metallization stack 148 extend between the intra- and extra-dielectric metallization layers 150, 154 to interconnect the metallization layers 150, 154. The ILD layer 152 may be, for example, a low κ dielectric or an oxide. The metallization layers 150, 154, the contacts 162, and the vias 164 may be, for example, aluminum copper or germanium.

Thus, as can be appreciated from above, the present disclosure provides a MEMS structure. A carrier substrate defines a lower surface of a cavity. The carrier substrate includes a first anti-stiction bump and a second anti-stiction bump arranged along the lower surface. An oxide layer lines an upper surface of the carrier substrate and sidewalls of the cavity. A MEMS device is arranged over the carrier substrate and bonded to the carrier substrate through the oxide layer. The MEMS device includes a movable mass suspended in the cavity over the first anti-stiction bump and laterally offset from the second anti-stiction bump.

In other embodiments, the present disclosure provides a method for manufacturing a MEMS structure. A first etch is performed into an upper surface of a carrier substrate to form a sacrificial support in a cavity. A thermal oxidation process is performed to oxidize the sacrificial support, and to form an oxide layer lining the upper surface and including the oxidized sacrificial support. A MEMS substrate is bonded to the carrier substrate over the carrier substrate and through the oxide layer. A second etch is performed into the MEMS substrate to form a movable mass overlying the cavity and supported by the oxidized sacrificial support. A third etch is performed into the oxide layer to laterally etch the oxidized sacrificial support and to remove the oxidized sacrificial support.

In yet other embodiments, the present disclosure provides a MEMS structure. A carrier substrate having a lower cavity arranged within an upper surface of the carrier substrate. The carrier substrate includes an anti-stiction bump arranged along a lower surface of the lower cavity. A MEMS device arranged over the carrier substrate. The MEMS device includes a movable mass suspended over the anti-stiction bump. A sacrificial barrier arranged at a periphery of the lower cavity around the anti-stiction bump and the movable mass, and extending from the lower surface of the lower cavity to the MEMS device. An IC arranged over the MEMS device.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a microelectromechanical systems (MEMS) structure, the method comprising:
    performing a first etch into an upper surface of a carrier substrate to form a sacrificial support in a cavity;
    performing a thermal oxidation process to oxidize the sacrificial support, and to form an oxide layer lining the upper surface and including the oxidized sacrificial support, wherein the oxidized sacrificial support is sandwiched between and adjoins air gaps respectively on opposite sides of the oxidized sacrificial support;
    bonding a MEMS substrate to the carrier substrate over the carrier substrate and through the oxide layer;
    performing a second etch into the MEMS substrate to form a movable mass overlying the cavity and supported by the oxidized sacrificial support; and
    performing a third etch into the oxide layer to laterally etch the oxidized sacrificial support and to remove the oxidized sacrificial support.

2. The method according to claim 1, further including:
    performing the thermal oxidation process to form an anti-stiction bump integrated with the carrier substrate and underlying the oxidized sacrificial support, wherein the anti-stiction bump has a width of about 2 micrometers to about 4 micrometers and a height of about 1 micrometer to about 2 micrometers.

3. The method according to claim 1, further including:
    forming the sacrificial support with a width of about 2 micrometers to about 4 micrometers.

4. The method according to claim 1, further including:
    forming the oxidized sacrificial support with a width of about 4 micrometers to about 8 micrometers.

5. The method according to claim 1, further including:
    performing the first etch to form a sacrificial barrier at a periphery of the cavity and laterally shifted from the sacrificial support;
    performing the thermal oxidation process to oxidize the sacrificial barrier, and to form the oxide layer including the oxidized sacrificial barrier; and
    performing the third etch between the oxidized sacrificial support and the oxidized sacrificial barrier to at least partially remove the oxidized sacrificial barrier.

6. The method according to claim 5, further including:
    forming the sacrificial barrier laterally shifted from the sacrificial support by a distance of about 2 micrometers to about 50 micrometers.

7. The method according to claim 5, further including:
    forming the sacrificial barrier with a width of about 2 micrometers to about 4 micrometers.

8. The method according to claim 5, further including:
    forming the sacrificial support and the sacrificial barrier with a line shape and extending in parallel between opposing sidewalls of the cavity.

9. The method according to claim 5, further including:
    forming the oxidized sacrificial barrier having a width of about 4 micrometers to about 8 micrometers.

10. A method for manufacturing a microelectromechanical systems (MEMS) structure, the method comprising:
    performing a first etch into a top surface of a first silicon substrate to form a cavity in the first silicon substrate, and to further form a plurality of silicon protrusions protruding from a bottom surface of the cavity to the top surface of the first silicon substrate;

performing a thermal oxidation process to convert the silicon protrusions to oxide protrusions, and to further form an oxide layer conformally lining the top surface of the first silicon substrate and the cavity, wherein the oxide layer includes the oxide protrusions;

bonding a second silicon substrate to the first silicon substrate through the oxide layer, wherein the second silicon substrate contacts the oxide protrusions during the bonding;

performing a second etch into the second silicon substrate to form a movable mass overlying the cavity; and performing a third etch into the oxide layer, through the second silicon substrate, to laterally etch the oxide layer and to remove at least one of the oxide protrusions.

11. The method according to claim 10, wherein the thermal oxidation process forms a plurality of semiconductor bumps of silicon respectively covered by and contacting the oxide protrusions.

12. The method according to claim 10, wherein the bonding comprises fusion bonding at an interface between the second silicon substrate and the oxide layer.

13. The method according to claim 10, wherein the silicon and oxide protrusions are formed with rectangular profiles.

14. The method according to claim 10, wherein the oxide protrusions comprise a support protrusion and a pair of barrier protrusions, wherein the movable mass is formed directly over and contacting the support protrusion, wherein the barrier protrusions are laterally spaced between the support protrusion and a sidewall of the cavity, and wherein the third etch removes the support protrusion and at least one of the barrier protrusions.

15. The method according to claim 14, wherein the support protrusion and the barrier protrusions are formed with rectangular profiles that are laterally spaced from one another.

16. A method for manufacturing a microelectromechanical systems (MEMS) structure, the method comprising:

patterning a first substrate to form a cavity and a plurality of first-material protrusions, wherein the first-material protrusions are recessed into the cavity;

oxidizing the first-material protrusions to partially consume the first-material protrusions and to form a plurality of second-material protrusions, wherein the second-material protrusions respectively overlie the first-material protrusions and are a different material than the first-material protrusions;

bonding a second substrate to the first substrate, wherein the second substrate overlies the cavity and is spaced from the first-material protrusions by the second-material protrusions;

patterning the second substrate to form a movable mass overlying the cavity; and performing an etching process to remove at least one of the second-material protrusions, but not the first-material protrusions.

17. The method according to claim 16, wherein the plurality of second-material protrusions comprises a first pair of second-material protrusions and a second pair of second-material protrusions, wherein the second-material protrusions of the first pair are between and laterally spaced from the second-material protrusions of the second pair, wherein the patterning of the second substrate forms the movable mass between and laterally spaced from the second-material protrusions of the first pair, and wherein the etching process removes the second-material protrusions of the first pair, but not the second-material protrusions of the second pair.

18. The method according to claim 16, wherein the plurality of second-material protrusions comprises a pair of second-material protrusions and a support-type second-material protrusion, wherein the patterning of the second substrate forms the movable mass between and laterally spaced from the second-material protrusions of the pair and further forms the movable mass directly over the support-type second-material protrusion, and wherein the etching process removes the support-type second-material protrusion, but not the second-material protrusions of the pair.

19. The method according to claim 16, wherein the oxidizing forms a silicon oxide layer covering the first substrate, wherein the silicon oxide layer is integrated with the second-material protrusions, wherein the silicon oxide layer has a pair of U-shaped segments defined in part by at least some of the second-material protrusions, and wherein the U-shaped segments are respectively on opposite sides of the cavity.

20. The method according to claim 16, wherein the oxidizing converts portions of the first-material protrusions into the second-material protrusions and further forms a dielectric layer conformally lining a top surface of the first substrate and the cavity, wherein the dielectric layer includes the second-material protrusions, wherein the bonding bonds the second substrate to the top surface of first substrate through the dielectric layer and brings the second substrate into contact with exposed top surfaces of the second-material protrusions, and wherein each of the second-material protrusions protrudes upward from a top surface of a respective one of the first-material protrusions.

* * * * *